(12) United States Patent
Park

(10) Patent No.: US 8,497,855 B2
(45) Date of Patent: Jul. 30, 2013

(54) SCAN DRIVING APPARATUS AND DRIVING METHOD FOR THE SAME

(75) Inventor: Seong-Il Park, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 260 days.

(21) Appl. No.: 12/929,225

(22) Filed: Jan. 10, 2011

(65) Prior Publication Data

US 2011/0273434 A1 Nov. 10, 2011

(30) Foreign Application Priority Data

May 7, 2010 (KR) .................. 10-2010-0043141

(51) Int. Cl.
*G09G 5/00* (2006.01)

(52) U.S. Cl.
USPC .............. 345/205; 345/89; 345/100; 345/213

(58) Field of Classification Search
USPC .................. 345/89, 92, 98, 100, 205, 213
See application file for complete search history.

(56) References Cited

U.S. PATENT DOCUMENTS

2003/0227433 A1* 12/2003 Moon ........................... 345/100
2008/0012818 A1* 1/2008 Lee et al. ...................... 345/100

FOREIGN PATENT DOCUMENTS

| JP | 2001-147674 A | 5/2001 |
|---|---|---|
| KR | 10-0896404 B1 | 6/2003 |
| KR | 10 2006-0093239 A | 8/2006 |
| KR | 10 2007-0002155 A | 1/2007 |

* cited by examiner

*Primary Examiner* — Amare Mengistu
*Assistant Examiner* — Premal Patel
(74) *Attorney, Agent, or Firm* — Lee & Morse, P.C.

(57) ABSTRACT

A scan driving apparatus, includes scan driving blocks, each including a first and a second input terminal where a frame start or a scan signal of an adjacent scan driving block is input during forward and backward direction driving, respectively, wherein each of the scan driving blocks transmits a first scan direction signal instructing forward scan driving to a first transistor adjusting a clock signal in accordance with a signal input to the first input terminal, transmits a second scan direction signal instructing backward scan driving to the first transistor in accordance with a signal input to the second input terminal, and outputs the clock signal as a corresponding scan signal, the even numbered ones of the scan driving blocks receive a first clock signal as the clock signal, the odd numbered ones of the scan driving blocks receive a second clock signal as the clock signal.

16 Claims, 6 Drawing Sheets

SCAN DRIVING APPARATUS AND DRIVING METHOD FOR THE SAME

BACKGROUND

1. Field

Embodiments relate to a scan driving apparatus and a driving method for the same. More particularly, embodiments relate to a scan driving apparatus for a flat panel display and a method of driving the apparatus.

2. Description of the Related Art

Recently, a variety of flat panel displays that can reduce weight and volume, drawbacks of cathode ray tubes, have been developed. As the flat panel displays, there are liquid crystal displays (LCD), field emission displays, plasma display panels (PDP), and organic light emitting diode (OLED) displays.

Flat panel displays include a display panel composed of a plurality of pixels arranged in a matrix. More particularly, such a display panel includes a plurality of scan lines formed in the row direction and a plurality of data lines formed in the column direction, in which the scan lines and the data lines are arranged across each other. The pixels are driven by scan signals and data signals transmitted from corresponding scan lines and data lines.

Flat panel displays may be categorized as a passive matrix type light emitting display device and an active matrix type light emitting display device, in accordance with the method of driving the pixels. The active matrix type, which selectively turns on/off the pixels, is mainly used in terms of resolution, contrast, and operation speed.

The active matrix type organic light emitting diode display receives data signals in synchronization with the time when scan signals are transmitted to the pixels. The scan signals may be transmitted to the scan lines in the forward direction in accordance with an arrangement order of scan lines, or transmitted to the scan lines in the backward direction in accordance with the arrangement order of scan lines. The active matrix type organic light emitting diode display can use a bidirectional scan driving apparatus that can transmit scan signals in the forward direction and the backward direction.

For example, it is possible to display an image on a display panel by writing data signals while transmitting scan signals in the forward direction to the scan lines and display an image inversely, e.g., bottom up rather than top down, by writing data signals while transmitting scan signals in the backward direction to the scan lines.

The active matrix type organic light emitting diode display using a bidirectional driving apparatus transmits various signals, including frame start signals FLM, a plurality of clock signals CLK1 and CLK2, a plurality of initializing signal INT1 and INT2, and a plurality of scan direction signals DIR and DIRB, to the bidirectional scan driving apparatus such that scan signals can be transmitted in both directions. In order to transmit such signals, the active matrix type organic light emitting diode display employs a plurality of wires to connect to the scan driving apparatus to achieve this configuration; however, the circuit becomes complicated and needs a large mounting area, such that it is complicated to operate the scan driving apparatus.

The above information disclosed in this Background section is only for enhancement of understanding of the background of the invention and therefore it may contain information that does not form the prior art that is already known in this country to a person of ordinary skill in the art.

SUMMARY

Embodiments are therefore directed to scan driving apparatus and methods of driving the same, which substantially overcome one or more of the problems due to the limitations and disadvantages of the related art.

It is therefore a feature of an embodiment to provide a scan driving apparatus having advantages of simplifying a bidirectional scan driving apparatus and decreasing complication in driving, and a method of driving the scan driving apparatus.

It is therefore a separate feature of an embodiment to provide a scan driving apparatus adapted to reduce a mounting area thereof as compared to comparable conventional devices.

It is therefore a separate feature of an embodiment to provide a method of driving a scan driving apparatus that is simplified as compared to comparable conventional methods.

It is therefore a separate feature of an embodiment to provide a scan driving apparatus including a simplified scan driving circuit as compared to comparable conventional devices.

It is therefore a separate feature of an embodiment to provide a backward scan driving approach, wherein a second clock signal may be output as a scan signal of an odd numbered scan driving block and input to a second input terminal of an even numbered scan driving block, and a first clock signal may be output as a scan signal of an even numbered scan driving block and input to the second input terminal of an odd numbered scan driving block.

At least one of the above and other features and advantages may be realized by providing a scan driving apparatus, including a plurality of scan driving blocks, each of the scan driving blocks including a first input terminal where a frame start signal or a scan signal of an adjacent scan driving block is input during forward direction driving, and a second input terminal where a frame start signal or a scan signal of an adjacent scan driving block is input during backward direction driving, wherein each of the scan driving blocks is adapted to transmit a first scan direction signal instructing forward scan driving to a first transistor adjusting a clock signal in accordance with a signal input to the first input terminal, to transmit a second scan direction signal instructing backward scan driving to the first transistor in accordance with a signal input to the second input terminal, and to output the clock signal as a corresponding scan signal, even numbered ones of the plurality of the scan driving blocks are adapted to receive a first clock signal as the clock signal, odd numbered ones of the plurality of the scan driving blocks are adapted to receive a second clock signal as the clock signal.

The first transistor of each of the plurality of scan driving blocks may include a first terminal coupled to a clock signal input terminal where the clock signal is input, a gate terminal coupled to a first scan direction signal input terminal where the first scan direction signal is input, and a second terminal coupled to an output terminal where the corresponding scan signal is output, and each of the plurality of scan driving blocks may further include a second transistor including a first terminal coupled to a high power source voltage, a gate terminal coupled to a second scan direction signal input terminal where the second scan direction signal is input, and a second terminal coupled to the output terminal where the scan signal is output, a third transistor including a gate terminal coupled to the first input terminal, a first terminal coupled to the first scan direction signal input terminal, and a second terminal coupled to the gate terminal of the first transistor, a fourth transistor including a gate terminal coupled to the first input terminal, a first terminal coupled to the second scan direction signal input terminal, and a second terminal coupled to the gate terminal of the second transistor, a fifth transistor including a gate terminal coupled to the second input terminal, a first terminal coupled to the second scan direction signal input terminal, and a second terminal coupled to the gate terminal of the first transistor, and a sixth transistor including a gate terminal coupled to the second input terminal, a first terminal coupled to the first scan direction signal input terminal, and a second terminal coupled to the gate terminal of the second transistor.

The first scan direction signal and the second scan direction signal may be applied at voltages of different logic levels.

The first transistor and the second transistor may be p-channel field effect transistors, and, for the forward direction scan driving, the first scan direction signal may be at a voltage of a constant logic low level for one frame and the second scan direction signal may be at a voltage of a constant logic high level for one frame.

The first transistor and the second transistor may be p-channel field effect transistors, and, for the backward direction scan driving, the first scan direction signal may be at a voltage of a constant logic high level for one frame and the second scan direction signal may be at a voltage of a constant logic low level for one frame.

The first clock signal may be a low-level pulse, and the third transistor, the fourth transistor, the fifth transistor, and the sixth transistor may be p-channel field effect transistors.

At least one of the above and other features and advantages may be separately realized by providing a scan driving apparatus, including a plurality of first scan driving blocks adapted to generate a plurality of first scan signals and to transmit the signals in a forward driving direction or a backward driving direction, and a plurality of second scan driving blocks adapted to generate a plurality of second scan signals and to transmit the signals in the forward driving direction or the backward driving direction, wherein each of the first scan driving blocks is adapted to receive a first clock signal, a forward second scan signal from an adjacent one of the second scan driving blocks in the forward driving direction during forward scan driving, and a backward second scan signal from an adjacent one of the second scan driving blocks in the backward driving direction during backward scan driving, and to generate the first clock signal as a corresponding first scan signal in accordance with the forward second scan signal or the backward second scan signal, wherein each of the second scan driving blocks is adapted to receive a second clock signal, a forward first scan signal from an adjacent one of the first scan driving blocks in the forward driving direction during forward driving, and a backward first scan signal from an adjacent one of the first scan driving blocks in the backward direction during backward driving, and to generate the second clock signal as a corresponding second scan signal in accordance with the forward first scan signal or the backward first scan signal.

Each of the first scan driving blocks may include a first input terminal adapted to receive the forward second scan signal, and a second input terminal adapted to receive the backward second scan signal.

A frame start signal may be input to the first input terminal and/or the second input terminal.

Each of the first scan driving blocks may be adapted to transmit a first scan direction signal instructing forward scan driving to a first transistor adapted to adjust the first clock signal and to output the first clock signal as a scan signal in accordance with the scan signal or the frame start signal input to the first input terminal.

Each of the first scan driving blocks may be adapted to transmit a second scan direction signal instructing backward scan driving to a first transistor adapted to adjust the first clock signal to output the first clock signal as a scan signal in accordance with the scan signal or the frame start signal input to the second input terminal.

Each of the second scan driving blocks may include a first input terminal adapted to receive the forward first scan signal, and a second input terminal adapted to receive the backward first scan signal.

A frame start signal may be input to the first input terminal and/or the second input terminal.

Each of the second scan driving blocks may be adapted to transmit a second scan direction signal instructing forward scan driving to a first transistor adapted to adjust the second clock signal to output the second clock signal as a scan signal in accordance with the scan signal or the frame start signal input to the first terminal.

Each of the second scan driving blocks may be adapted to transmit a second scan direction signal instructing backward scan driving to a first transistor adapted to adjust the second clock signal to output the second clock signal as a scan signal in accordance with the signal input to the second input terminal.

At least one of the above and other features and advantages may be separately realized by providing a method of driving a scan driving apparatus including a plurality scan driving blocks, the method including receiving a frame start signal or a scan signal of an adjacent scan driving block, a first scan direction signal, and a second scan direction signal, turning on a first transistor by applying one of the first scan direction signal and the second scan direction signal to the first transistor, through a second transistor turned on by the frame start signal or the scan signal of the adjacent scan driving block, and outputting a first clock signal as a first scan signal through the first transistor turned on, and receiving the first scan signal, the first scan direction signal, and the second scan direction signal, turning on a third transistor by applying any one of the first scan direction signal and the second scan direction signal to the third transistor, through a fourth transistor turned on by the first scan signal, and outputting a second clock signal as a second scan signal through the third transistor turned on.

The method may include transmitting any one of the first clock signal and the second clock signal to an even numbered scan driving block of the plurality of scan driving blocks, and transmitting the other one of the first clock signal and the second clock signal to an odd numbered scan driving block in the scan driving blocks.

For forward scan driving, the scan signal of the adjacent scan driving block may be a scan signal of an adjacent scan driving block arranged in advance in the scan driving blocks, and, for backward scan driving, the scan signal of the adjacent scan driving block may be a scan signal of an adjacent scan driving block arranged latter in the scan driving blocks.

The first scan direction signal and the second scan direction signal may be applied at voltages of different logic levels.

For forward scan driving, applying a voltage of a constant logic low level as the first scan direction signal for one frame and applying a voltage of a constant high level as the second scan direction signal for one frame, and, for backward scan driving, applying a voltage of a constant high logic level as the first scan direction signal for one frame and applying a voltage of a constant low level as the second scan direction signal for one frame.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
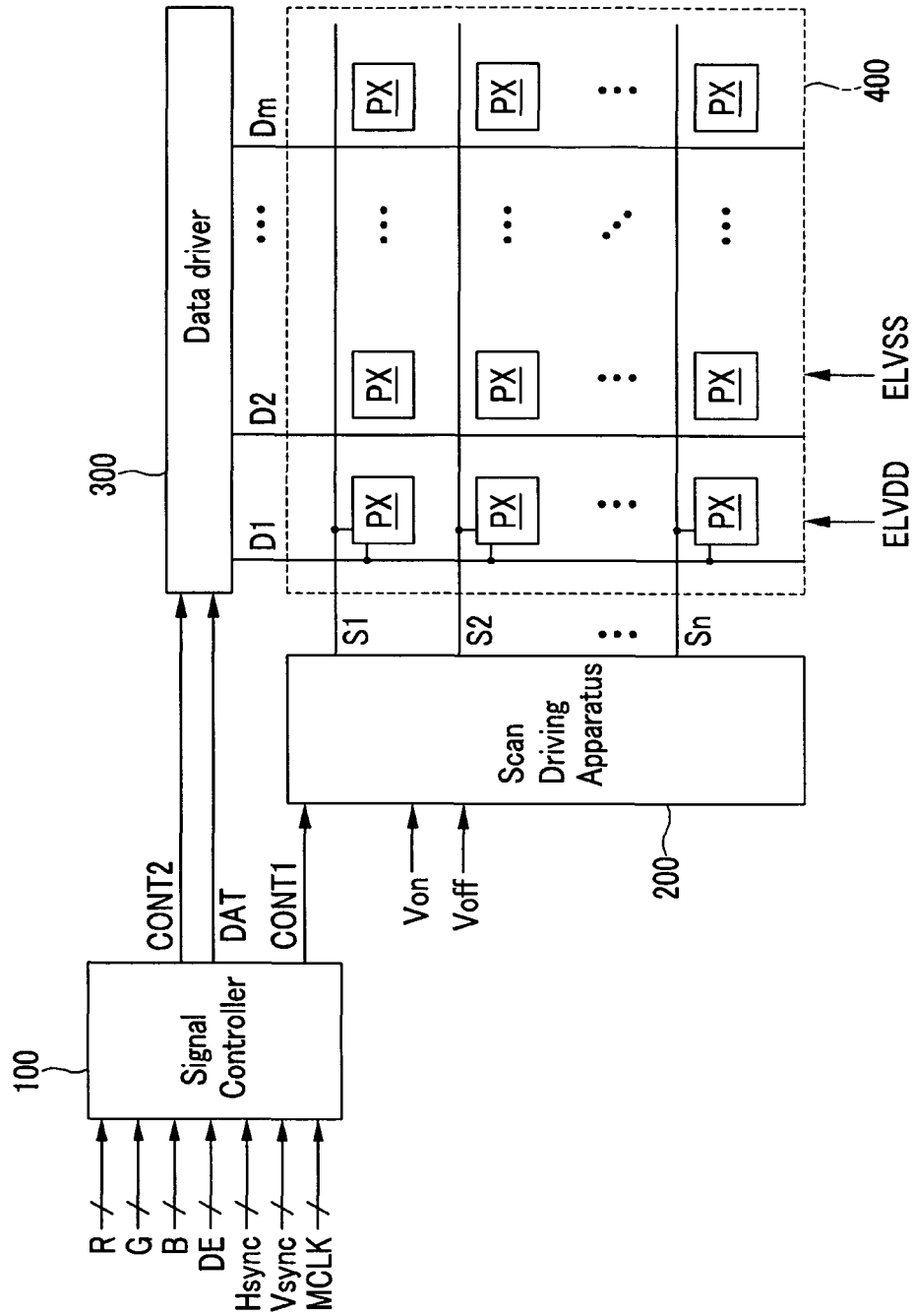
FIG. 1 illustrates a block diagram of an organic light emitting diode display according to an exemplary embodiment.

Korean Patent Application No. 10-2010-0043141, filed on May 7, 2010, in the Korean Intellectual Property Office, and entitled: "Scan Driving Apparatus and Driving Method for the Same," is incorporated by reference herein in its entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art In the drawing figures, the dimensions of layers and regions may be exaggerated for clarity of illustration. It will also be understood that when an element is referred to as being "on," "above", "below," or "under" another element, it can be directly "on," "above", "below," or "under" the other element, respectively, or intervening elements may also be present. In addition, it will also be understood that when an element is referred to as being "between" two elements, it can be the only layer between the two layers, or one or more intervening layers may also be present. Like reference numerals refer to like elements throughout the specification.

In this specification and the claims that follow, when it is described that an element is "coupled" to another element, the element may be "directly coupled" to the other element, "indirectly" coupled to the another element or "electrically coupled" to the another element through one or more other elements. In addition, unless explicitly described to the contrary, the word "comprise" and variations such as "comprises" or "comprising", will be understood to imply the inclusion of stated elements but not the exclusion of any other elements.

In order to elucidate features of the invention, known elements and/or elements that are not related to an understanding of the description of features will be omitted.

FIG. 1 illustrates a block diagram of an organic light emitting diode display according to an exemplary embodiment.

Referring to FIG. 1, an organic light emitting diode display may include a signal controller 100, a scan driving apparatus 200, data driver 300 and a display unit 400.

The signal controller 100 may receive video signals R, G, B input from an external device and input control signals for controlling display of the video signals. The video signals R, G, B include luminance information of the pixels PX. The luminance may have a predetermined number, for example, $1024=2^{10}$, $256=2^8$ or $64=2^6$ grays. For example, the input control signal may include a vertical synchronization signal Vsync, a horizontal synchronization signal Hsync, a main clock MCLK, and/or a data enable signal DE.

The signal controller 100 may appropriately process the input video signals R, G, B to fit the operational conditions of the display unit 400 and the data driver 300 on the basis of the input video signal R, G, B and the input control signal, and may generate a scan control signal CONT1, a data control signal CONT2, and an image data signal DAT. The signal controller 100 may transmit the scan control signal CONT1 to the scan driving apparatus 200. The signal controller 100 may transmit the data control signal CONT2 and the image data signal DAT to the data driver 300.

The display unit 400 may include a plurality of pixels PX coupled to a plurality of scan lines S1-Sn, a plurality of data lines D1-Dm, and a plurality of signal lines S1-Sn, D1-Dm. The pixels PX may be arranged substantially in a matrix. The scan lines S1-Sn may substantially extend in a row direction substantially in parallel with each other and the data lines D1-Dm may substantially extend in a column direction substantially in parallel with each other. The pixels PX of the display unit 400 may be supplied with a first power source voltage ELVDD and a second power source voltage ELVSS from the outside.

The scan driving apparatus 200 may be coupled with the scan lines S1~Sn and may apply scan signals including a gate-on voltage Von and a gate-off voltage Voff, in accordance with a scan control signal. The gate-on voltage Von may turn on a switching transistor (M1 in FIG. 2). The gate-off voltage Voff may turn off the switching transistor to the scan lines S1-Sn.

The scan control signal CONT1 may include a frame start signal FLM, a first clock signal CLK1, a second clock signal CLK2, a first scan direction signal DIR, and a second scan direction signal DIRB. The frame start signal FLM may be a signal generating the first scan signal for displaying video of one frame. The first clock signal CLK1 and the second clock signal CLK2 may be synchronization signals generating scan signals in the scan lines S1-Sn. The first clock signal CLK1 and the second clock signal CLK2 may enable generation and/or synchronization of scan signal in different scan lines. The first scan direction signal DIR and the second scan direction signal DIRB may be signals for controlling whether scan signals are applied in a forward direction or in a backward direction to the scan lines S1-Sn. For example, the first scan direction signal DIR may instruct forward scan driving and the second scan direction signal DIRB may instruct backward scan driving.

The scan driving apparatus 200 may generate scan signals in the forward direction or the backward direction and may sequentially transmit them to the scan lines S1-Sn, in accordance with the signals FLM, CLK1, CLK2, DIR, and DIRB included in the scan control signal CONT1.

The data driver 300 may be coupled to the data lines D1-Dm and may select a gray voltage according to the video data signal DAT. The data driver 300 may apply the gray voltage selected in accordance with the data control signal CONT2, as a data signal, to the data lines D1-Dm.

Figure 2:
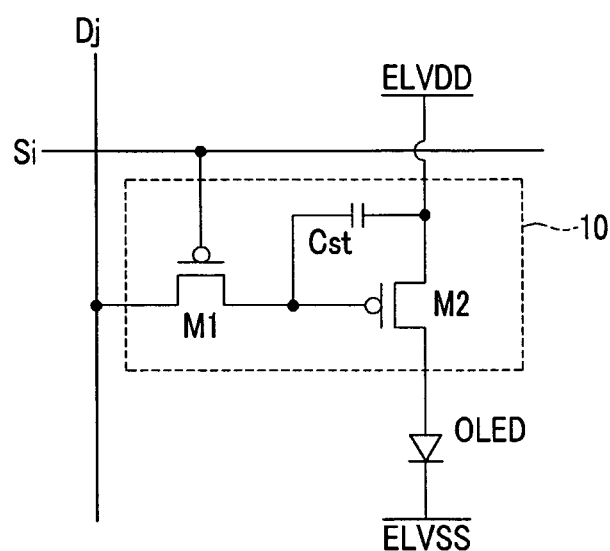
FIG. 2 illustrates a circuit diagram of a pixel according to an exemplary embodiment.

FIG. 2 illustrates a circuit diagram of a pixel according to an exemplary embodiment.

Referring to FIG. 2, the pixel PX of the organic light emitting diode display may include an organic light emitting diode or a pixel circuit 10 for controlling an organic light emitting diode. The pixel circuit 10 may include a switching transistor M1, a driving transistor M2, and a sustain capacitor Cst.

The switching transistor M1 may include a gate terminal coupled to the scan line Si, a first terminal coupled to the data line Dj, and a second terminal coupled to a gate terminal of the driving transistor M2.

The driving transistor M2 may include a gate terminal coupled to the second terminal of the switching transistor M1, a first terminal coupled to the ELVDD power source, and a second terminal coupled to an anode of the organic light emitting diode.

The sustain capacitor Cst may include a first terminal coupled to the gate terminal of the driving transistor M2 and a second terminal coupled to the ELVDD power source. The sustain capacitor Cst may store a data voltage applied to the gate terminal of the driving transistor M2 and may keep the voltage even after the switching transistor M1 is turned off.

The anode of the organic light emitting diode OLED may be coupled to the second terminal of the driving transistor M2. A cathode of the organic light emitting diode OLED may be coupled to the ELVSS power source.

The switching transistor M1 and the driving transistor M2 may be a p-channel field effect transistor. In this configuration, the gate-on voltage that turns on the switching transistor M1 and the driving transistor M2 is a logic low level voltage and the gate-off voltage that turns off them is a logic high level voltage.

Although the p-channel field effect transistor is selected in this configuration, the switching transistor M1 and/or the driving transistor M2 may be an n-channel field effect transistor, in which a gate-on voltage that turns on the n-channel field effect transistor is a logic high level voltage and a gate-off voltage that turns of it is a logic low level voltage.

Referring to FIG. 2, when the gate-on voltage Von is applied to the scan line Si, the switching transistor M1 is turned on and the data signal applied to the data line Dj is applied to the first terminal of the sustain capacitor Cst through the switching transistor M1 that is in an on state, thereby the sustain capacitor Cst may be charged. The driving transistor M2 may control an amount of current flowing to the organic light emitting diode from the ELVDD power source, corresponding to a voltage value stored in the sustain capacitor Cst. The organic light emitting diode may generate light corresponding to the amount of current flowing through the driving transistor M2.

The organic light emitting diode may emit light having one of the primary colors. For example, the primary colors may be the three primary colors, red, green and blue, and desired colors may be implemented by spatial or time combination of the primary colors. In this configuration, some of the organic light emitting diodes can emit white light, in which the luminance increases. Alternatively, the organic light emitting diodes in all of the pixels PX can emit white light and some of the pixels PX can further include a color filter (not shown) that change the white light emitted from the organic light emitting diodes into any one of the primary colors.

The driving apparatuses 100, 200, and 300 described above may be each mounted directly on the display unit 400 as, e.g., one integrated circuit, mounted on a flexible printed circuit film, mounted on the display unit 400, as a TCP (tape carrier package), mounted on an independent printed circuit board, or integrated on the display unit 400 together with the signal lines S1-Sn, D1-Dm.

Figure 3:
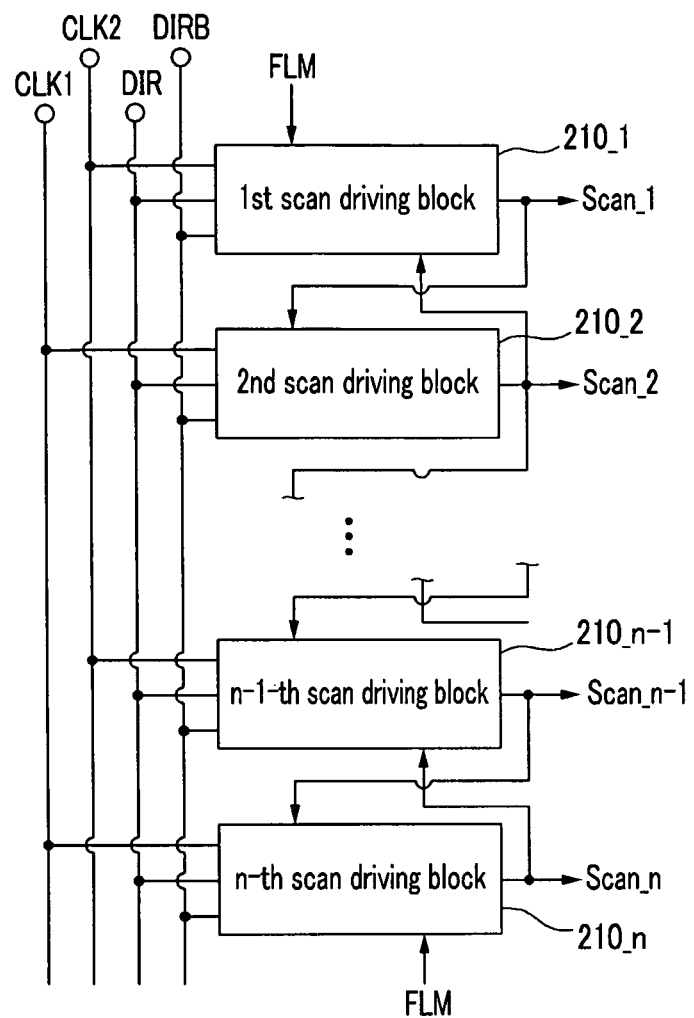
FIG. 3 illustrates a block diagram of a scan driving apparatus according to an exemplary embodiment.

FIG. 3 illustrates a block diagram of a scan driving apparatus according to an exemplary embodiment.

Referring to FIGS. 1 and 3, the scan driving apparatus 200 may include a plurality of scan driving blocks 210_1-210_n that may generate a plurality of scan signals. The scan driving blocks 210_1-210_n may respectively generate scan signal Scan_1-Scan_n that may be respectively transmitted to the scan lines S1-Sn. For example, the first scan driving block 210_1 may generate and transmit a scan signal Scan_1 to the first scan line S1, the second scan driving block 210_2 may generate and transmit a scan signal Scan_2 to the second scan line S2, and the n-th scan driving block 210_n may generate and transmit a scan signal Scan_n to the n-th scan line (Sn).

Hereinafter, assume that n is an even number. A driving method in which the scan signals Scan_1-Scan_n are sequentially transmitted from the first scan line S1 to the n-th scan line Sn is called forward scan driving. A driving method in which the scan signals Scan_1-Scan_n are sequentially transmitted from the n-th scan line Sn to the first scan line S1 is called backward scan driving.

In the forward scan driving, the first scan driving block 210_1 may transmit the scan signal Scan_1 generated in response to the frame start signal FLM to the first scan line S1 and the second scan driving block 210_2. Further, the second scan driving block 210_2 may transmit the scan signal Scan_2 generated in response to the scan signal Scan_1 of the first scan driving block 210_1 to the second scan line S2 and the third scan driving block 210_3. In such embodiments, e.g., the k+1-th scan driving block may output a scan signal Scan_k+1 generated in response to a scan signal Scan_k output from the k-th scan driving block, which is the adjacent scan driving block ($1 \leq k < n$).

In the backward scan driving, the n-th scan driving block 210_n may transmit the scan signal Scan_n to the n-th scan line Sn and the n-1-th scan driving block 210_n-1, in response to the frame start signal FLM. Further, the n-1-th scan driving 210_n-1 transmits the scan signal Scan_n-1 to the n-1-th scan line Sn1 and the n-2-th scan driving block 210_n-2, in response to the scan signal Scan_n. That is, the k-th scan driving block may output a scan signal Scan_k in response to the scan signal Scan_k+1 output from the k+1-th scan driving block, which is the adjacent scan driving block ($1 \leq k < n$).

Still referring to FIGS. 1 and 3, in embodiments, the control signals CONT1 input in the odd numbered scan driving blocks 210_1, . . . , 210_n-1 and the even numbered scan driving blocks 210_2, . . . , 210_n may be different. The second clock signal CLK2, the first scan direction signal DIR, and the second scan direction signal DIRB may be input in the odd numbered scan driving blocks 210_1, . . . , 210_n-1. The first clock signal CLK1, the first scan direction signal DIR, and the second scan direction signal DIRB may be input in the even numbered scan driving blocks 210_2, . . . , 210_n.

In this configuration, in the following description, assume that the even numbered scan driving blocks are the first scan driving blocks, the scan signals output from the first scan driving blocks are first scan signals, the odd numbered scan driving blocks are the second scan driving blocks, and the scan signals output from the second scan driving blocks are the second scan signals.

The first scan driving blocks, e.g., even number scan driving blocks, may each receive the first clock signal CLK1 and two second scan signals of two, e.g., forward adjacent and backward adjacent ones, of the second scan driving blocks and may generate, e.g., the first clock signal CLK1, as a corresponding first scan signal in accordance with any one of the two second scan signals. More particularly, the first scan driving blocks, e.g., even number scan driving blocks, may each receive one second scan signal from an adjacent one of the second driving blocks relative to forward direction and another second scan signal from an adjacent one of the second driving blocks relative to the backward direction. For example, the $2^{nd}$ scan driving block may receive one second scan signal Scan_1 from the $1^{st}$ scan driving block relative to the forward direction and another second scan signal Scan_3 from the $3^{rd}$ scan driving block relative to the backwards direction, and may generate a scan signal Scan_2, e.g., the first clock signal CLK1, in accordance with the second scan signal Scan_1 or the another second scan signal Scan_3.

Referring still to FIG. 3, the second scan driving blocks, e.g., odd number scan driving blocks, may each receive the second clock signal CLK2 and two first scan signals of two, e.g., forward adjacent and backward adjacent ones, of the first scan driving blocks and may generate, e.g., the second clock signal CLK2, as the respective scan signal in accordance with any one of the two first scan signals. More particularly, the second scan driving blocks, e.g., odd number scan driving blocks, may each receive one first scan signal from an adjacent one of the first driving blocks relative to the forward direction and another first scan signal from an adjacent one of the first driving blocks relative to the backward direction. For example, the 3rd scan driving block may receive one first scan signal Scan_2 from the $2^{nd}$ scan driving block relative to the forward direction and another first scan signal Scan_4 from the $4^{th}$ scan driving block relative to the backwards direction, and may generate a scan signal Scan_3, e.g., the second clock signal CLK2, in accordance with the first scan signal Scan_2 or the another first scan signal Scan_4.

Figure 4:
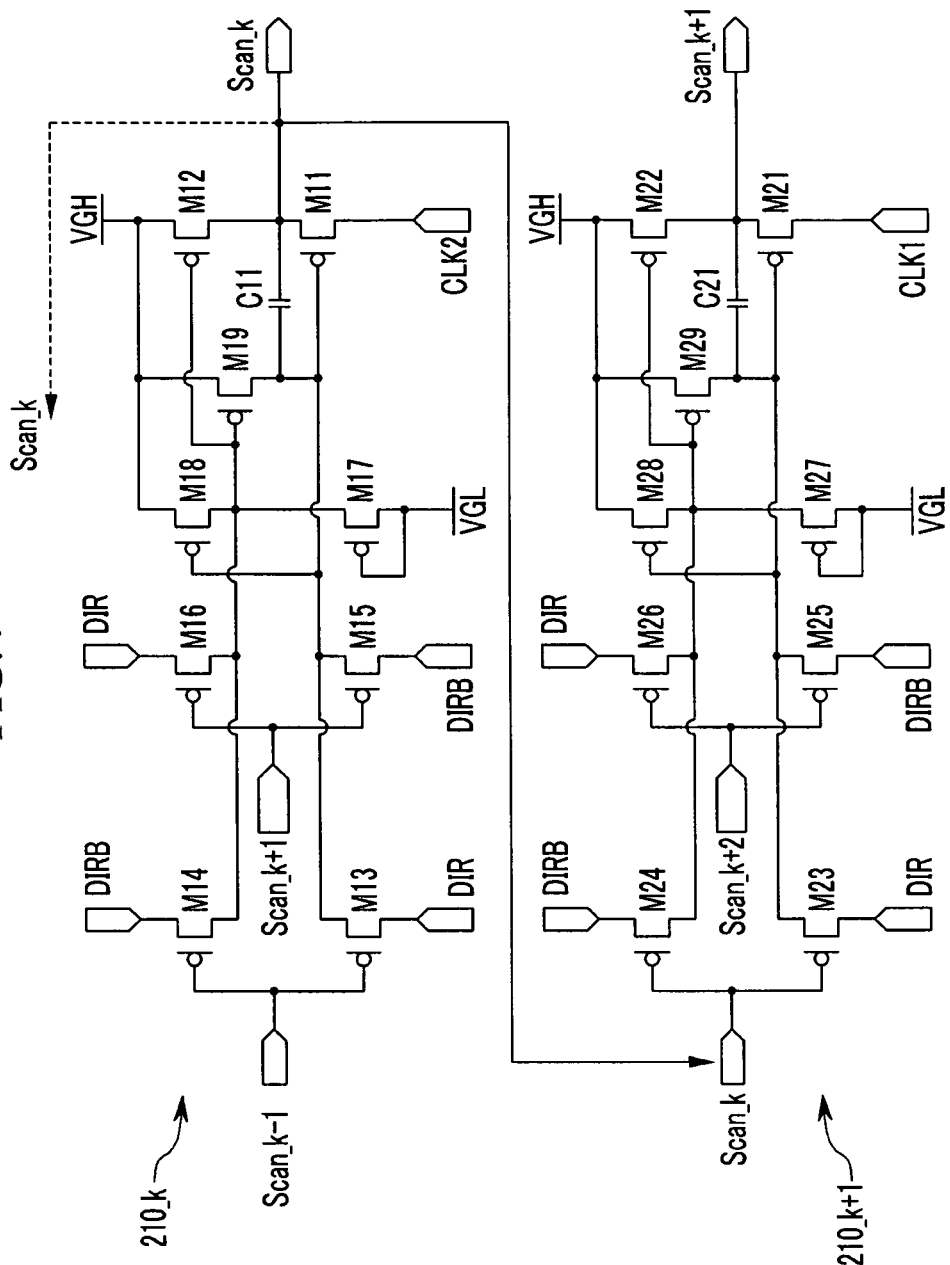
FIG. 4 illustrates a circuit diagram of the scan driving apparatus of FIG. 3.

FIG. 4 illustrates a circuit diagram of the scan driving apparatus of FIG. 3.

Referring to FIG. 4, the k-th scan driving block 210_k and the k+1-th scan driving block 210_k+1 are shown as exemplary ones of the scan driving blocks included in the scan driving apparatus 200. In the following description, assume that k is an odd number and forward scan driving is implemented. More particularly, the exemplary configuration of the scan driving blocks is described by exemplifying the k-th scan driving block 210_k.

The scan driving block 210_k may include a plurality of transistors M11-M19 and a scan signal sustain capacitor C11. Assume that the transistors M11-M19 are p-channel field effect transistors. Embodiments are not limited thereto, and at least any one of the transistors M11-M19 may be an n-channel field effect transistor, and accordingly, in such embodiments, voltage levels of signals may be changed, e.g., inversed, to turn on the n-channel field effect transistor.

Further, the scan driving block 210_k may include a first input terminal where the scan signal Scan_k−1 of the adjacent scan driving block arranged in advance for forward scan driving is input, a second input terminal where the scan signal Scan_k+1 of the adjacent scan driving block arranged latter for reverse scan driving is input, an input terminal of the first scan direction signal DIR, an input terminal of the second scan direction signal DIRB, an input terminal of the clock signal CLK2, and a scan signal output terminal Scan_k.

The first transistor M11 may include a gate terminal coupled to a first terminal of the third transistor M13 and a first terminal of the fifth transistor M15, a first terminal coupled to the input terminal of the clock signal CLK2, and a second terminal coupled to the scan signal output terminal Scan_k. The first transistor M11 adjusts the clock signal output as the scan signal.

The second transistor M12 may include a gate terminal coupled to a first terminal of the fourth transistor M14 and a first terminal of the sixth transistor M16, a first terminal coupled to the high power source voltage VGH, and a second terminal coupled to the scan signal output terminal Scan_k.

The third transistor M13 may include a gate terminal coupled to the first input terminal Scan_k−1, a second terminal coupled to the input terminal of the first scan direction signal DIR, and, as discussed above, the first terminal coupled to the gate terminal of the first transistor M11.

The fourth transistor M14 may include a gate terminal coupled to the first input terminal Scan_k−1, a second terminal coupled to the input terminal of the second scan direction signal DIRB, and, as discussed above, the first terminal coupled to the gate terminal of the second transistor M12.

The third transistor M13 and the fourth transistor M14 may be turned on or off in accordance with the level of the signal Scan_k−1 input to the first input terminal. When the scan signal Scan_k−1 is input at a voltage of a logic low level to the first input terminal and the third transistor M13 and the fourth transistor M14 are turned on, the first scan direction signal DIR is transmitted to the gate terminal of the first transistor M11 and the second scan direction signal DIRB is transmitted to the gate terminal of the second transistor M12.

In the forward scan driving, the first scan direction signal DIR may be applied at a voltage of a logic low level and the second scan direction signal DIRB may be applied at a voltage of a logic high level. In the backward scan driving, the first scan direction signal DIR may be applied at a voltage of a logic high level and the second scan direction signal DIRB may be applied at a voltage of a logic low level. That is, the first scan direction signal DIR and the second scan direction signal DIRB may be constantly applied at voltages of different logic levels, for one frame.

The fifth transistor M15 may include a gate terminal coupled to the second input terminal Scan_k+1, a second terminal coupled to the input terminal of the second scan direction signal DIRB, and, as discussed above, the first terminal coupled to the gate terminal of the first transistor M11.

The sixth transistor M16 may include a gate terminal coupled to the second input terminal Scan_k+1, a second terminal coupled to the input terminal of the first scan direction signal DIR, and, as discussed above, the first terminal coupled to the gate terminal of the second transistor M12.

The fifth transistor M15 and the sixth transistor M16 may be turned on or off in accordance with the level of the scan signal Scan_k+1 input to the second input terminal. When the scan signal Scan_k+1 is input at a voltage of a logic low level to the second input terminal Scan_k+1 and the fifth transistor M15 and the sixth transistor M16 are turned on, the second scan direction signal DIRB is transmitted to the gate terminal of the first transistor M11 and the first scan direction signal DIR is transmitted to the gate terminal of the second transistor M12.

In the forward scan driving, the scan signal Scan_k−1 of a logic low level is input to the first input terminal Scan_k−1, and no scan signal is input to the second input terminal Scan_k+1. However, a frame start signal FLM of a logic low level is input to the first input terminal Scan_k−1 of the first scan driving block 210-1.

In the backward scan driving, a scan signal Scan_k+1 at a voltage of a logic low level is input to the second input terminal Scan_k+1 and no scan signal is input to the first input terminal Scan_k−1. However, a frame start signal FLM of a logic low level is input to the second input terminal Scan_k+1 in the last scan driving block 210_n.

The seventh transistor M17 may include a gate terminal coupled to a low power source voltage VGL, a first terminal coupled to the low power source voltage VGL, and a second terminal coupled to a first terminal of the eighth transistor M18.

The eighth transistor M18 may include a gate terminal coupled to the first terminal of the third transistor M13 and the first terminal of the fifth transistor M15, a second terminal coupled to the high power source voltage VGH, and, as discussed above, the first terminal coupled to the first terminal of the fourth transistor M14 and the first terminal of the sixth transistor M16.

The ninth transistor M19 may include a gate terminal coupled to the other end of the first terminal of the fourth transistor M14 and the first terminal of the sixth transistor M16, a first terminal coupled to the high power source voltage VGH, and a second terminal coupled to the gate terminal of the first transistor M11.

In this configuration, the high power source voltage VGH and the low power source voltage VGL may be voltage signals of a logic high level and a logic low level, respectively.

The second clock signal CLK2 may be input to the input terminal of a clock signal in the odd numbered scan driving block 210_k and the first clock signal CLK1 may be input to the input terminal of a clock signal in the even numbered scan driving block 210_k+1.

The scan signal sustain capacitor C11 may include a first terminal coupled to the gate terminal of the first transistor M11 and a second terminal coupled to the second terminal of the first transistor M11.

The scan signal output terminal of the k-th scan driving block 210_k may be coupled to the k-th scan line Sk. Further, for forward scan driving, the scan signal output terminal of the k-th scan driving block 210_k may be coupled to the first input terminal of the k+1-th scan driving block 210_k+1. Further, for backward scan driving, the scan signal output terminal of the k-th scan driving block 210_k may be coupled to the second input terminal of the k−1-th scan driving block 210_k−1.

The k+1-th scan driving block 210_k may include a plurality of transistors M21-M29 and a scan signal sustain capacitor C21. The k+1-th scan driving block 210_k+1 may have the same configuration as the k-th scan driving block 210_k, except that the first clock signal CLK1 may be input to the clock signal input terminal. That is, the odd numbered scan driving blocks and the even numbered scan driving blocks may have the same configuration, except for the clock signals input to the clock signal input terminals. Therefore, a detailed description for the configuration of the k+1-th scan driving block 210_k+1 is not provided.

Hereafter, a method of driving an organic light emitting diode display and a scan driving apparatus according to an exemplary embodiment is described.

The signal controller 100 may transmit the scan control signal CONT1 including the frame start signal FLM, the first clock signal CLK1, the second clock signal CLK2, the first scan direction signal DIR, and the second scan direction signal DIRB to the scan driving apparatus 200, and the video data signal DAT and the data control signal CONT2 to the data driver 300.

The data driver 300 may generate data signals for the row in 1 horizontal period (1H, the same as the period a horizontal synchronization signal (Hsync) and data enable signal (DE)) and may transmit the data signals to the data lines D1-Dm, and the scan driving apparatus 200 may transmit the scan signals sequentially in the forward direction or the backward direction in 1 horizontal period 1H.

As described above, as the data signals and the scan signals for the pixels arranged in one row are repeatedly transmitted in 1 horizontal period 1H, the data signals are input to all of the pixels and video of one frame may be displayed.

The scan driving apparatus 200 may perform forward scan driving or backward scan driving in accordance with the scan control signal CONT1.

Hereafter, the odd numbered scan driving block is described in view of the exemplary k-th scan driving block 210_k shown in FIG. 4 and the even numbered scan driving block is described in view of the exemplary k+1-th scan driving block 210_k+1 shown in FIG. 4.

Figure 5:
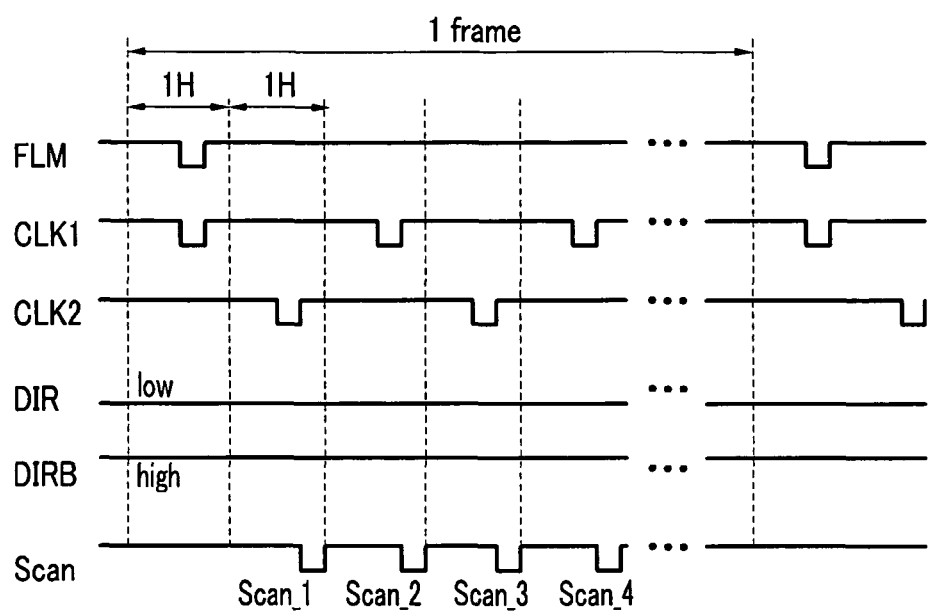
FIG. 5 illustrates a timing diagram corresponding to a method of driving a scan driving apparatus according to an exemplary embodiment.

Forward scan driving is described first with reference to FIGS. 3, 4 and 5.

FIG. 5 illustrates a timing diagram corresponding to a method of driving a scan driving apparatus according to an exemplary embodiment.

The frame start signal FLM is transmitted to the scan driving apparatus 200 at the first 1 horizontal period, for one frame.

The first clock signal CLK1 and the second clock signal CLK2 are alternately transmitted to the scan driving apparatus 200 for two horizontal periods. The first clock signal CLK1 is transmitted to the even numbered scan driving block in the scan driving blocks included in the scan driving apparatus 200 and the second clock signal CLK2 is transmitted to the odd numbered scan driving block. In the exemplary embodiment, the frame start signal FLM, the first clock signal CLK1, and the second clock signal CLK2 are low-level pulses for turning on the p-channel field effect transistor.

In the forward scan driving, the first scan direction signal DIR and the second scan direction signal DIRB are transmitted to the scan driving apparatus 200, at a voltage of a constant logic low level and at a voltage of a constant logic high level for one frame, respectively.

In the first 1 horizontal period, the frame start signal FLM is input to the first input terminal of the first scan driving block in 210_1, or 210_k in FIG. 4). The frame start signal FLM of a logic low level turns on the third transistor M13 and the fourth transistor M14. In such embodiments, no signal of a logic low level may be input to the second input terminal, and the fifth transistor M15 and the sixth transistor M16 may be kept on.

The second scan direction signal DIRB of a logic high level is transmitted to the gate terminal of the second transistor M12 and the gate terminal of the ninth transistor M19, through the fourth transistor M14 turned on. The second transistor M12 and the ninth transistor M19 are turned off. The first scan direction signal DIR of a logic low level is transmitted to the gate terminal of the first transistor M11 and the gate terminal of the eighth transistor M18, through the third transistor M13 turned on. The first transistor M11 and the eighth transistor M18 are turned on.

In the second 1 horizontal period, the second clock signal CLK2 is input to the clock signal input terminal and the second clock signal CLK2 is output to the scan signal output terminal through the first transistor M11 turned on. The second clock signal CLK2 of a logic low level is output to the scan signal output terminal, as the scan signal Scan_1 of the first scan driving signal block 210_1. The scan signal sustain capacitor C11 maintains the output of the scan signal Scan_1.

The scan signal Scan_1 of the first scan driving block 210_1 is input to the first input terminal of the second scan driving block 210_2 (k=1 in 210_k+1 in FIG. 4). The scan signal Scan_1 of the first scan driving block 210_1 of a logic low level turns on the third transistor M23 and the fourth transistor M24. In such embodiments, no signal of a logic low level may be input to the second input terminal, and the fifth transistor M25 and the sixth transistor M26 may be kept off.

The second scan direction signal DIRB of a logic high level is transmitted to the gate terminal of the second transistor M22 and the gate terminal of the ninth transistor M29, through the fourth transistor M24 turned on. The second transistor M22 and the ninth transistor M29 are turned off The first scan direction signal DIR of a logic low level is transmitted to the gate terminal of the first transistor M21 and the gate terminal of the eighth transistor M28, through the third transistor M23 turned on. The first transistor M21 and the eighth transistor M28 are turned on.

In the third 1 horizontal period, the first clock signal CLK1 is input to the clock signal input terminal and the first clock signal CLK1 is output to the scan signal output terminal through the first transistor M21 turned on. The first clock signal CLK1 of a logic low level is output to the scan signal output terminal, as the scan signal Scan_2 of the second scan driving block 210_2. The scan signal sustain capacitor C21 maintains the output of the scan signal Scan_2.

The scan signal Scan_2 of the second scan driving block 210_2 is input to the first input terminal of the next scan driving block.

As described above, in the forward scan driving, the second clock signal CLK2 is output as a scan signal of the odd numbered scan driving block and input to the first input terminal of the even numbered scan driving block. Further, the first clock signal CLK1 is output as a scan signal of the even numbered scan driving block and input to the first input terminal of the odd numbered scan driving block.

In this method, scan signals are sequentially applied to all of the scan lines S1-Sn and data signals corresponding to the pixel of the rows are applied to the pixels, thereby displaying video of one frame.

Hereafter, backward scan driving is described with reference to FIGS. 3, 4 and 6.

Figure 6:
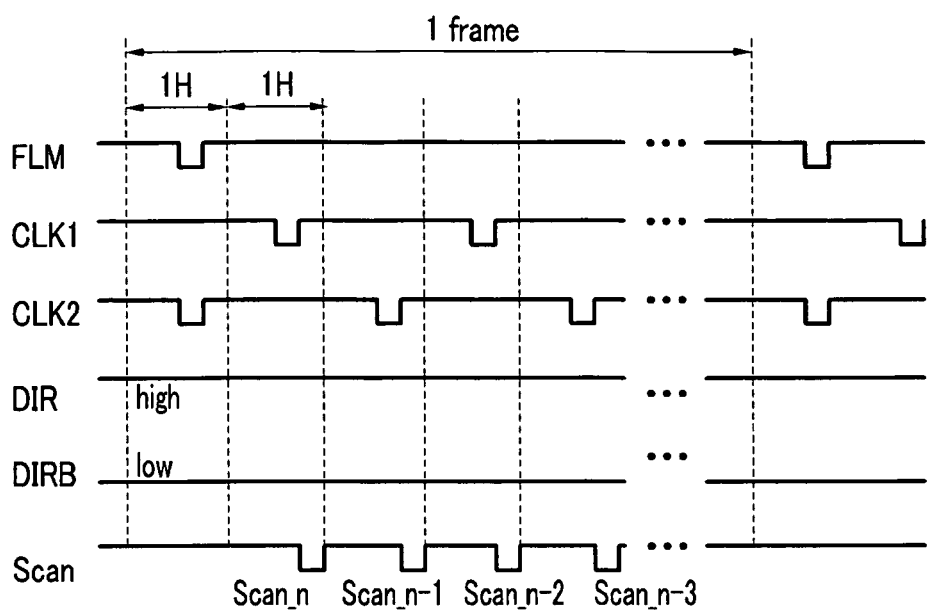
FIG. 6 illustrates a timing diagram corresponding to a method of driving a scan driving apparatus according to another exemplary embodiment.

FIG. 6 illustrates a timing diagram corresponding to a method of driving a scan driving apparatus according to another exemplary embodiment.

The frame start signal FLM may be transmitted to the scan driving apparatus 200 at the first 1 horizontal period, for one frame. The first clock signal CLK1 may be transmitted to the even numbered scan driving block and the second clock signal CLK2 is transmitted to the odd numbered scan driving block. Assume that the n scan driving blocks included in the scan driving apparatus 200 are even numbered blocks, that is, n is an even number.

In the reverse scan driving, the first scan direction signal DIR and the second scan direction signal DIRB may be transmitted to the scan driving apparatus 200 at a voltage of a logic high level and at a voltage of a logic low level for one frame, respectively.

In the first 1 horizontal period, the frame start signal FLM may be input to the second input terminal of the n-th scan driving block 210_n (k=n-1 in 210_k+1 in FIG. 4). The frame start signal FLM of a logic low level turns on the fifth transistor M25 and the sixth transistor M26. In such embodiments, no signal of a logic low level is input to the first input terminal, and the third transistor M23 and the fourth transistor M24 are kept off.

The first scan direction signal DIR of a logic high level may be transmitted to the gate terminal of the second transistor M22 and the gate terminal of the ninth transistor M29, through the sixth transistor M26 turned on. The second transistor M22 and the ninth transistor M29 are turned off The second scan direction signal DIRB of a logic low level may be transmitted to the gate terminal of the first transistor M21 and the gate terminal of the eighth transistor M28, through the fifth transistor M25 turned on. The first transistor M21 and the eighth transistor M28 are turned on.

In the second 1 horizontal period, the first clock signal CLK1 may be input to the clock signal input terminal and the first clock signal CLK1 may be output to the scan signal output terminal through the first transistor M21 turned on. The first clock signal CLK1 of a logic low level is output to the scan signal output terminal, as the scan signal Scan_n of the n-th scan driving block 210_n.

The scan signal Scan_n of the n-th scan driving block 210_n is input to the second input terminal in the n-1-th scan driving block 210_n-1 (k=n-1 in 210_k of FIG. 4). The scan signal Scan_n of the n-th scan driving block 210_n of a logic low level turns on the fifth transistor M15 and the sixth transistor M16. The first scan direction signal DIR of a logic high level may be transmitted to the gate terminal of the second transistor M12 and the gate terminal of the ninth transistor M19, through the sixth transistor M16 turned on. The second transistor M12 and the ninth transistor M19 are turned off. The second scan direction signal DIRB of a logic low level may be transmitted to the gate terminal of the first transistor M11 and the gate terminal of the eighth transistor M18, through the fifth transistor M15 turned on. The first transistor M11 and the eighth transistor M18 are turned on.

In the third 1 horizontal period, the second clock signal CLK2 may be input to the clock signal input terminal and the second clock signal CLK2 is output to the scan signal output terminal through the first transistor M11 turned on. The second clock signal CLK2 of a logic low level may be output to the scan signal output terminal, as the scan signal Scan n-1 of the n-1-th scan driving block 210_n-1.

The scan signal Scan_n-1 of the n-1-th scan driving block 210_n-1 may be input to the second input terminal of the next scan driving block.

As described above, in the backward scan driving, the second clock signal CLK2 is output as a scan signal of the odd numbered scan driving block and input to the second input terminal of the even numbered scan driving block. Further, the first clock signal CLK1 is output as a scan signal of the even numbered scan driving block and input to the second input terminal of the odd numbered scan driving block.

In this method, scan signals are sequentially applied to all of the scan lines S1-Sn and data signals corresponding to the pixel of the rows are applied to the pixels, thereby displaying video of one frame.

In the existing bidirectional scan driving, the frame start signal FLM, the clock signals CLK1 and CLK2, the scan direction signals DIR, DIRB, and/or a plurality of initializing signals INT1 and INT2 may be employed. However, in the method proposed herein, it is possible to reduce the signals for bidirectional scan driving and the wires for transmitting the signals, such that it is possible to reduce complication of the circuit and decrease the mounting area of the scan driving apparatus as compared to comparable conventional apparatus.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A scan driving apparatus, comprising:
 a plurality of scan driving blocks, each of the scan driving blocks including:
   a first input terminal where a frame start signal or a scan signal of an adjacent scan driving block is input during forward direction driving; and
   a second input terminal where the frame start signal or the scan signal of an adjacent scan driving block is input during backward direction driving,
 wherein each of the scan driving blocks includes:
 a first switching unit connected to the first input terminal, the first switching unit receiving a first scan direction signal instructing forward scan driving and a second scan direction signal, the first switching unit being configured to transmit the first scan direction signal to a first transistor adjusting a clock signal in accordance with a signal input to the first input terminal, a second switching unit connected to the second input terminal, the second switching unit receiving the first scan direction signal and the second scan direction signal, the second switching unit being configured to transmit the second scan direction signal to the first transistor in accordance with a signal input to the second input terminal, the first transistor being turned on by one of the first and second scan direction signals from one of the first and second switching units turned on by the frame start signal or the scan signal of the adjacent scan driving block, and wherein each scan driving block is configured to output the clock signal as a corresponding scan signal through the first transistor turned on, wherein even numbered ones of the plurality of the scan driving blocks are configured to receive a first clock signal as the clock signal, and wherein odd numbered ones of the plurality of the scan driving blocks are configured to receive a second clock signal as the clock signal.

2. The scan driving apparatus as claimed in claim 1, wherein the first transistor of each of the plurality of scan driving blocks includes a first terminal coupled to a clock signal input terminal where the clock signal is input, a gate terminal coupled to a first scan direction signal input terminal where the first scan direction signal is input, and a second terminal coupled to an output terminal where the corresponding scan signal is output, and each of the plurality of scan driving blocks further includes:

a second transistor including a first terminal coupled to a high power source voltage, a gate terminal coupled to a second scan direction signal input terminal where the second scan direction signal is input, and a second terminal coupled to the output terminal where the scan signal is output;

the first switching unit including
  a third transistor including a gate terminal coupled to the first input terminal, a first terminal coupled to the first scan direction signal input terminal, and a second terminal coupled to the gate terminal of the first transistor, and
  a fourth transistor including a gate terminal coupled to the first input terminal, a first terminal coupled to the second scan direction signal input terminal, and a second terminal coupled to the gate terminal of the second transistor; and the second switching unit including
  a fifth transistor including a gate terminal coupled to the second input terminal, a first terminal coupled to the second scan direction signal input terminal, and a second terminal coupled to the gate terminal of the first transistor, and
  a sixth transistor including a gate terminal coupled to the second input terminal, a first terminal coupled to the first scan direction signal input terminal, and a second terminal coupled to the gate terminal of the second transistor.

3. The scan driving apparatus as claimed in claim 2, wherein the first scan direction signal and the second scan direction signal are applied at voltages of different logic levels.

4. The scan driving apparatus as claimed in claim 3, wherein the first transistor and the second transistor are p-channel field effect transistors, and, for the forward direction scan driving, the first scan direction signal is at a voltage of a constant logic low level for one frame and the second scan direction signal is at a voltage of a constant logic high level for one frame.

5. The scan driving apparatus as claimed in claim 3, wherein the first transistor and the second transistor are p-channel field effect transistors, and, for the backward direction scan driving, the first scan direction signal is at a voltage of a constant logic high level for one frame and the second scan direction signal is at a voltage of a constant logic low level for one frame.

6. The scan driving apparatus as claimed in claim 2, wherein the first clock signal is a low-level pulse, and the third transistor, the fourth transistor, the fifth transistor, and the sixth transistor are p-channel field effect transistors.

7. A scan driving apparatus, comprising:
  a plurality of first scan driving blocks configured to generate a plurality of first scan signals and to transmit the signals in a forward driving direction or a backward driving direction; and
  a plurality of second scan driving blocks configured to generate a plurality of second scan signals and to transmit the signals in the forward driving direction or the backward driving direction,
  wherein each of the first scan driving blocks is configured:
    to receive a first clock signal,
    to receive a forward second scan signal from an adjacent one of the second scan driving blocks in the forward driving direction during forward scan driving,
    to receive a backward second scan signal from an adjacent one of the second scan driving blocks in the backward driving direction during backward scan driving,
    to turn on a first transistor by applying a first direction scan signal instructing forward scan driving when the forward second scan signal is supplied,
    to turn on the first transistor by applying a second direction scan signal instructing backward scan driving when the backward second scan signal is supplied, and
    to generate the first clock signal as a corresponding first scan signal in accordance with the forward second scan signal or the backward second scan signal,
  wherein each of the second scan driving blocks is configured:
    to receive a second clock signal,
    to receive a forward first scan signal from an adjacent one of the first scan driving blocks in the forward driving direction during forward driving,
    to receive a backward first scan signal from an adjacent one of the first scan driving blocks in the backward direction during backward driving,
    to turn on the first transistor by applying the first direction scan signal when the forward first scan signal is supplied,
    to turn on the first transistor by applying the second direction scan signal when the backward first scan signal is supplied, and
    to generate the second clock signal as a corresponding second scan signal in accordance with the forward first scan signal or the backward first scan signal.

8. The scan driving apparatus as claimed in claim 7, wherein each of the first and second scan driving blocks includes:
  a first input terminal configured to receive the forward second scan signal; and a second input terminal configured to receive the backward second scan signal.

9. The scan driving apparatus as claimed in claim 8, wherein a frame start signal is input to the first input terminal and/or the second input terminal.

10. The scan driving apparatus as claimed in claim 8, wherein each of the first and second scan driving blocks includes:
   a first switching unit connected to the first input terminal, the first switching unit receiving the first scan direction signal and the second scan direction signal, the first switching unit being configured to transmit the first scan direction signal to the first transistor adjusting a clock signal in accordance with a signal input to the first input terminal, and
   a second switching unit connected to the second input terminal, the second switching unit receiving the first scan direction signal and the second scan direction signal, the second switching unit being configured to transmit the second scan direction signal to the first transistor in accordance with a signal input to the second input terminal, the first transistor being turned on by one of the first and second scan direction signals from one of the first and second switching units turned on by a frame start signal or a scan signal of the adjacent scan driving block, wherein each scan driving block is configured to output the clock signal as a corresponding scan signal through the first transistor turned on.

11. The scan driving apparatus as claimed in claim 10, wherein the first transistor of each of the first and second scan driving blocks includes a first terminal coupled to a clock signal input terminal where the clock signal is input, a gate terminal coupled to a first scan direction signal input terminal where the first scan direction signal is input, and a second terminal coupled to an output terminal where the corresponding scan signal is output, and each of the first and second scan driving blocks further includes:
   a second transistor including a first terminal coupled to a high power source voltage, a gate terminal coupled to a second scan direction signal input terminal where the second scan direction signal is input, and a second terminal coupled to the output terminal where the scan signal is output;
   the first switching unit including
      a third transistor including a gate terminal coupled to the first input terminal, a first terminal coupled to the first scan direction signal input terminal, and a second terminal coupled to the gate terminal of the first transistor, and
      a fourth transistor including a gate terminal coupled to the first input terminal, a first terminal coupled to the second scan direction signal input terminal, and a second terminal coupled to the gate terminal of the second transistor; and
   the second switching unit including
      a fifth transistor including a gate terminal coupled to the second input terminal, a first terminal coupled to the second scan direction signal input terminal, and a second terminal coupled to the gate terminal of the first transistor, and
      a sixth transistor including a gate terminal coupled to the second input terminal, a first terminal coupled to the first scan direction signal input terminal, and a second terminal coupled to the gate terminal of the second transistor.

12. A method of driving a scan driving apparatus including a plurality scan driving blocks, the method comprising:
   receiving a frame start signal or a scan signal of an adjacent scan driving block, a first scan direction signal, and a second scan direction signal, turning on a first transistor by applying one of the first scan direction signal and the second scan direction signal to the first transistor, through a second transistor turned on by the frame start signal or the scan signal of the adjacent scan driving block, and outputting a first clock signal as a first scan signal through the first transistor turned on; and
   receiving the first scan signal, the first scan direction signal, and the second scan direction signal, turning on a third transistor by applying any one of the first scan direction signal and the second scan direction signal to the third transistor, through a fourth transistor turned on by the first scan signal, and outputting a second clock signal as a second scan signal through the third transistor turned on.

13. The method of driving a scan driving apparatus as claimed in claim 12, further comprising:
   transmitting any one of the first clock signal and the second clock signal to an even numbered scan driving block of the plurality of scan driving blocks, and
   transmitting the other one of the first clock signal and the second clock signal to an odd numbered scan driving block in the scan driving blocks.

14. The method of driving a scan driving apparatus as claimed in claim 12, wherein:
   for forward scan driving, the scan signal of the adjacent scan driving block is a scan signal of an adjacent scan driving block arranged in advance in the scan driving blocks, and
   for backward scan driving, the scan signal of the adjacent scan driving block is a scan signal of an adjacent scan driving block arranged latter in the scan driving blocks.

15. The method of driving a scan driving apparatus as claimed in claim 12, wherein the first scan direction signal and the second scan direction signal are applied at voltages of different logic levels.

16. The method of driving a scan driving apparatus as claimed in claim 15, wherein:
   for forward scan driving, applying a voltage of a constant logic low level as the first scan direction signal for one frame and applying a voltage of a constant high level as the second scan direction signal for one frame; and
   for backward scan driving, applying a voltage of a constant high logic level as the first scan direction signal for one frame and applying a voltage of a constant low level as the second scan direction signal for one frame.

* * * * *